United States Patent [19]

Beer

[11] Patent Number: 4,953,216

[45] Date of Patent: Aug. 28, 1990

[54] APPARATUS FOR THE TRANSMISSION OF SPEECH

[75] Inventor: Guenther Beer, Spardorf, Fed. Rep. of Germany

[73] Assignee: Siemens Aktiengesellschaft, Berlin and Munich, Fed. Rep. of Germany

[21] Appl. No.: 298,758

[22] Filed: Jan. 19, 1989

[30] Foreign Application Priority Data

Feb. 1, 1988 [DE] Fed. Rep. of Germany ....... 3802903

[51] Int. Cl.[5] ........................ H04R 25/00; H03G 5/00

[52] U.S. Cl. ........................ 381/68.4; 381/68; 381/68.2; 381/94

[58] Field of Search ........................ 381/68.4, 68, 68.2, 381/94, 47; 455/221, 225

[56] References Cited

U.S. PATENT DOCUMENTS

| | | | |
|---|---|---|---|
| 3,803,357 | 9/1974 | Sacks | 381/94 |
| 3,818,149 | 6/1974 | Stearns et al. | 381/68.4 |
| 4,185,168 | 1/1980 | Graupe et al. . | |
| 4,506,381 | 3/1985 | Ono . | |
| 4,508,940 | 4/1985 | Steeger . | |
| 4,680,798 | 7/1987 | Neumann . | |

FOREIGN PATENT DOCUMENTS

| | | |
|---|---|---|
| 0219025 | 5/1987 | European Pat. Off. . |
| PS2452998 | 5/1975 | Fed. Rep. of Germany . |
| OS3027953 | 2/1982 | Fed. Rep. of Germany . |

OTHER PUBLICATIONS

"Clincal Results of Hearing aid with Noise-Level-Controlled Selective Amplication", Ono et al, Audiology, vol. 22 (1983) pp. 494–515.

*Primary Examiner*—Jin F. Ng
*Assistant Examiner*—M. Nelson McGeary, III
*Attorney, Agent, or Firm*—Hill, Van Danten, Steadman & Simpson

[57] ABSTRACT

An apparatus for the transmission of speech, suitable for use in a hearing aid, has an acoustic input transducer followed by a controlled-gain broadband amplifier, which is followed by a parallel circuit of a number of frequency-selecting channels. The frequency-selecting channels divide the broadband output signal of the controlled-gain amplifier into a number of selected frequency channels. A threshold switch is included in each frequency-selecting channel. An acoustic output transducer is supplied with the sum of the output signals of the individual threshold switches.

3 Claims, 3 Drawing Sheets

APPARATUS FOR THE TRANSMISSION OF SPEECH

BACKGROUND OF THE INVENTION

1. Field of the Invention

The present invention is directed to an apparatus for the transmission of speech, and in particular to such an apparatus suitable for use in a hearing aid including an acoustic input transducer and an acoustic output transducer, and a threshold circuit interconnected therebetween.

2. Description of the Prior Art

German Patent No. 2,452,998 discloses a hearing aid including a broadband threshold switch, which acts on the output signal of the microphone (acoustic input transducer) so that the output signal is attenuated during pauses in speech, and is transmitted broadband in the presence of speech. This known circuit has the disadvantage that superimposed unwanted signals (for example, noise) are transmitted broadband in all frequency ranges when speech signals are present. As a result, the unwanted signals are audible in those ranges in which they are not covered by spectral components of the speech (for example, high-frequency unwanted signals remain clearly audible given low-frequency vowels, or the lower-frequency unwanted signals continue to be audible as well given higher-frequency sibilants).

A partially multi-channel circuit for suppressing unwanted signals, which functions without threshold switches, is disclosed in U.S. Pat. No. 4,185,168, and is also described in the article "Clinical Results Of Hearing Aid With Noise-Level-Controlled Selective Amplification," Hiroshi Ono et al, Audiology Vol. 22, 1983, Pages 494–515. A similar multi-channel hearing aid circuit is described in U.S. Pat. No. 4,508,940, which also operates without a threshold circuit.

German OS No. 30 27 953 discloses a hearing aid having a microphone, an amplifier stage with a modulator, and a receiver. A series of filter circuits which form frequency-selecting channels are connected in parallel to the output of the amplifier stage. A threshold circuit can be integrated into the evaluation circuits of the frequency-selecting channels. The output of the filter circuits is combined at a demodulator, from which the sum of the output signals is supplied to the receiver via a final amplifier, which may contain a sound diaphragm.

SUMMARY OF THE INVENTION

It is an object of the present invention to provide an apparatus for the transmission of speech signals including threshold switches, wherein unwanted components are suppressed in those regions in which these unwanted signals are not covered by spectral components of the speech.

The above object is achieved in an apparatus for the transmission of speech which has an acoustic input transducer and an acoustic output transducer, with a threshold circuit connected therebetween. The input transducer is followed by a broadband controlled-gain amplifier, which is in turn followed by a parallel circuit including a plurality of frequency-selecting channels. The frequency-selecting channels divide the broadband output signal of the controlled-gain amplifier into a selected number of frequency channels. A threshold switch is included in each frequency-selecting channel, and the acoustic output transducer is supplied with the sum of the output signals of the individual threshold switches. All of the threshold switches are constructed using a controlled-gain amplifier, and one of the threshold switches is supplemented by an automatic gain controlled amplifier circuit. The control signals supplied to the respective inputs of the controlled-gain amplifiers forming the threshold switches are derived from the input signal of the automatic gain controlled amplifier circuit.

The division of the broadband input signal into a plurality of frequency-selecting channels, and the use of a threshold switch in each selecting channel, achieves the result that only those frequency channels in which spectral components of the speech are present are opened or conducting, whereas those channels wherein such frequency components are not present remain closed, or non-conducting. The result is that unwanted signals are only co-transmitted in those frequency-selecting channels wherein louder speech is present. Unwanted signals in the frequency-selecting channels wherein no speech components are present are completely suppressed. Because the unwanted signals are transmitted only in those frequency channels wherein louder speech signals are simultaneously present, the unwanted signals are always covered by the louder speech signals, and the unwanted signals are thus no longer audible. A noticeable improvement in the speech intelligibility is thereby achieved.

DESCRIPTION OF THE PREFERRED EMBODIMENTS

Figure 1:
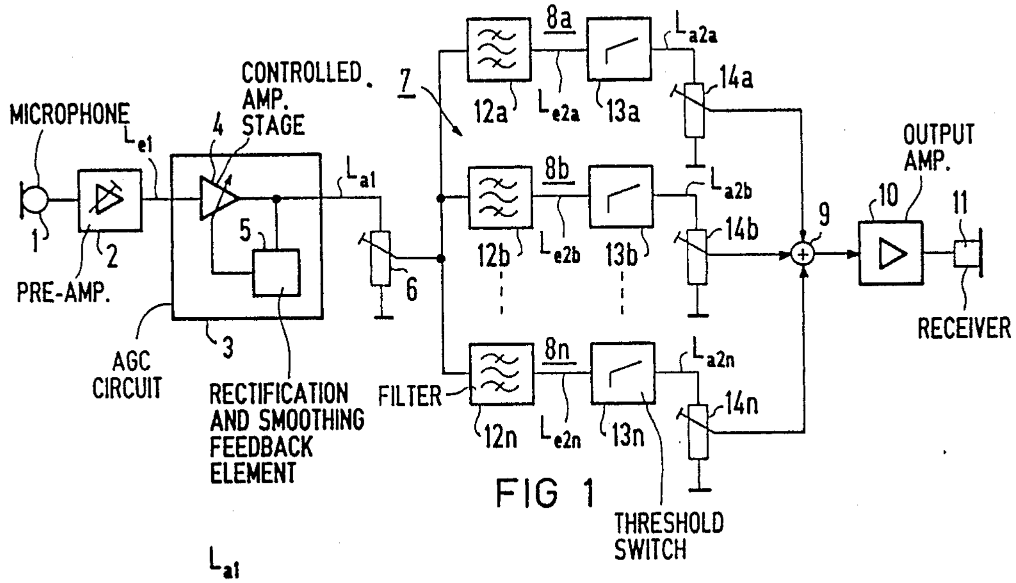
FIG. 1 is a schematic block diagram of a circuit for speech transmission constructed in accordance with the principles of the present invention.

A fundamental circuit diagram is shown in FIG. 1 for a circuit for the transmission of speech. The circuit can be used in any type of device wherein speech transmission is desired, however, the circuit is particularly suitable for use in a hearing aid.

The circuit shown in FIG. 1 includes an input microphone 1 (acoustic input transducer), a pre-amplifier 2, a controlled-gain amplifier 3, (automatic gain control, AGC circuit). The AGC circuit includes a gain control stage 4 and a rectification and smoothing feedback element 5. The remainder of the overall circuit includes a setting potentiometer 6, a parallel circuit 7 having a plurality of frequency-selecting channels 8*a* . . . *n* having outputs connected to a summing element 9, an output amplifier 10, and a receiver 11 (acoustic output transducer).

Each frequency-selecting channel 8*a* . . . *n* includes an input frequency filter 12*a* . . . *n* which, in cooperation with each other, divide the frequency range of the speech into different frequency bands. The frequency channels 8*a* . . . *n* further include respective threshold switches 13*a* . . . *n* following the frequency filters 12*a* . . . *n*. The output signals of the threshold switches 13*a* . . . *n* are supplied via gain control stages 14*a* . . . *n* to the summing element 9, with variable amplitude.

Figure 2:
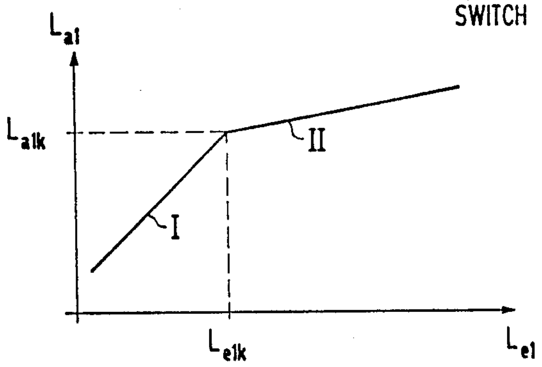
FIG. 2 is a graph showing the functioning of the broadband controlled-gain amplifier in the circuit of FIG. 1.

The controlled gain amplifier 3 has an operating characteristic for $L_{a1k}$ as a function of $L_{e1}$ (wherein $L_{a1}$ is the output voltage level in dB, and $L_{e1}$ is the input voltage level in dB) as shown in FIG. 2. Thus, when the input voltage level $L_{e1}$ is below a value $L_{e1k}$, the output voltage level $L_{a1}$ linearly follows the input voltage level according to branch I of the characteristic curve. When the input voltage level $L_{a1}$ exceeds the value $L_{e1k}$ (which corresponds to the output voltage level $L_{a1k}$) the voltage output level $L_{a1}$ again linearly follows the input voltage level $L_{e1}$, but with less of a slope, as shown in branch II of the characteristic curve.

Figure 3:
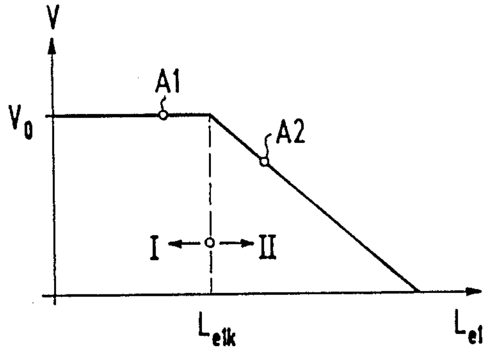
FIG. 3 is a graph derived from FIG. 2 showing the gain of the controlled-gain amplifier in FIG. 1 dependent on the level of the input signal.
Figure 4:
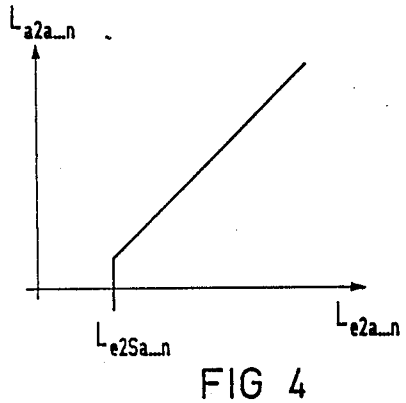
FIG. 4 is a graph related to the functioning of the threshold switches in the circuit of FIG. 1 for each frequency-selecting channel.

The characteristic curve from which the curve for the gain V in dB is derived dependent on the input level $L_{e1}$, is shown in FIG. 3. This curve is thus derived from the characteristics of the curves shown in FIG. 2. The setting of the operating points of the circuit arrangement is selected so that, in the absence of speech, the input signal results in an operating point Al of the controlled-gain amplifier 3, below the point $L_{e1k}$. The fundamental gain in branch I is then a constant $V_0$. Given the presence of speech, the input level $L_{e1}$ rises above the value $L_{e1k}$. The operating point of the controlled-gain amplifier 3 is now in the range II, at the point A2, wherein the gain decreases with increasing input signal level $L_{e1}$, as shown in FIG. 3. The unwanted noise which remains constant in level is thus attenuated, and falls below the threshold $L_{e2s}$ of the respective threshold switch 13*a* . . . *n* in those frequency-selecting channels 8*a* . . . *n* in which no speech is present, as shown in FIG. 4. The unwanted noise is thus suppressed in those channels. The frequency-selecting channels having loud speech components continue to contain unwanted noise components, however, these noise components are substantially inaudible because of the masking characteristics of hearing the speech.

Figure 5:
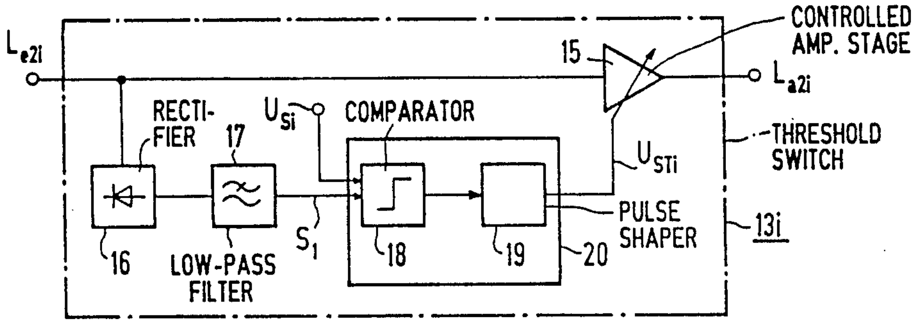
FIG. 5 is a block circuit diagram of a threshold switch in a frequency-selecting channel in the circuit diagram of FIG. 1.

As shown in FIG. 5, each threshold switch 13*a* . . . *n* is constructed of a controlled-gain amplifier 15, driven by a control voltage $U_{STa \ldots n}$ which is acquired in the threshold switch. The control voltage is acquired from the input signals $L_{e2a \ldots n}$ rectification in a rectifier 16, preferably a full-wave rectifier, with subsequent smoothing in a low-pass filter 17. The output of the filter 17 is compared in a comparator 18 to a variable comparison voltage $U_{Sa \ldots n}$. The output of the comparator 18 is supplied to a pulse-shaping element 19 which "rounds" the edges of the pulse. The switching threshold $L_{e2Sa \ldots n}$ for each individual threshold switch 13*a* . . . *n* is individually adjustable via the respective comparison voltages $U_{Sa \ldots n}$. The rounding of the rectangular output signals of the comparator 18 avoids unwanted switching "clicks" in the signal supplied for the gain control of the controlled-gain amplifier 15.

Figure 7:
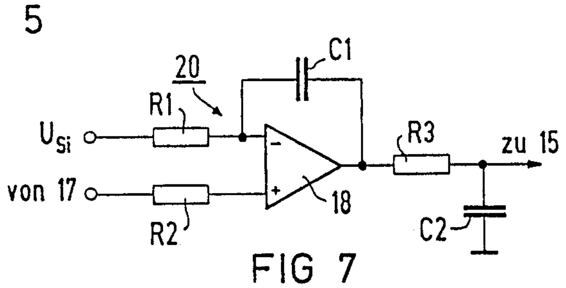
FIG. 7 is a more detailed embodiment of the comparator and a pulse-shaping circuits used in the threshold switch shown in FIG. 5.

An exemplary embodiment 20 of a circuit consisting of a comparator and a pulse-shaping element is shown in FIG. 7. The comparator 18 is a differential amplifier having an output in the form of a square-wave. The square-wave signals are rounded by ohmic resistors R1, R2 and R3, and capacitors C1 and C2. The capacitor C1 defines the "roundness" of the trailing edge, and the capacitor C2 defines the "roundness" of the leading edge. The degree of rounding of each of the edges of the pulse is thus independently adjustable.

FIGS. 6A–6D show signal curves within a selected channel i (with reference to FIG. 5) given an input signal mix to the overall system of speech and noise. The suppression of the unwanted signal during the pauses in speaking in channel i can clearly be seen by comparing the output signals $L_{a2i}$ to the input signal $L_{e2i}$.

Figure 8:
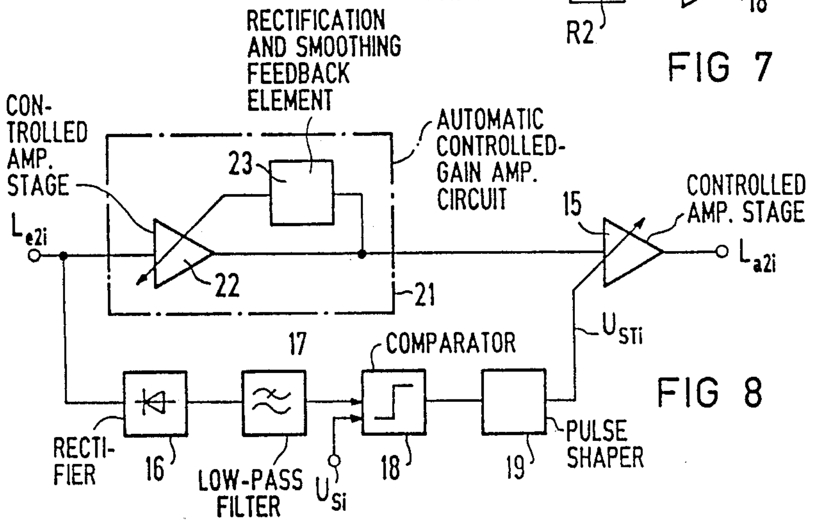
FIG. 8 is a schematic block diagram of a combination circuit including the threshold switch of FIG. 5 together with a controlled-gain amplifier circuit.
Figure 9:
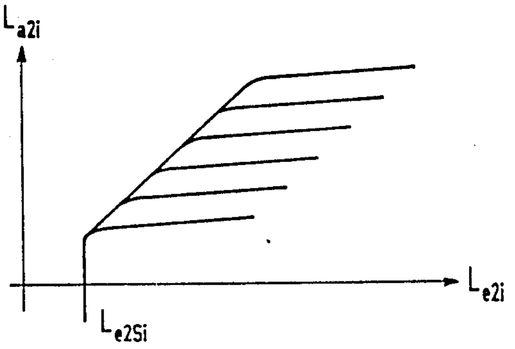
FIG. 9 is a graph showing the operating characteristics of the circuit of FIG. 8.
Figure 6A:
FIGS. 6A–6D show various signals plotted over time at various locations in the threshold switch circuit shown in FIG. 5.
Figure 6B:
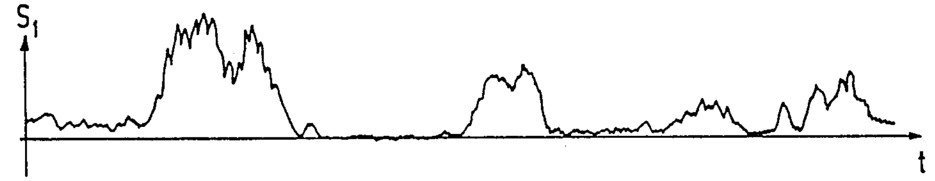
Figure 6C:
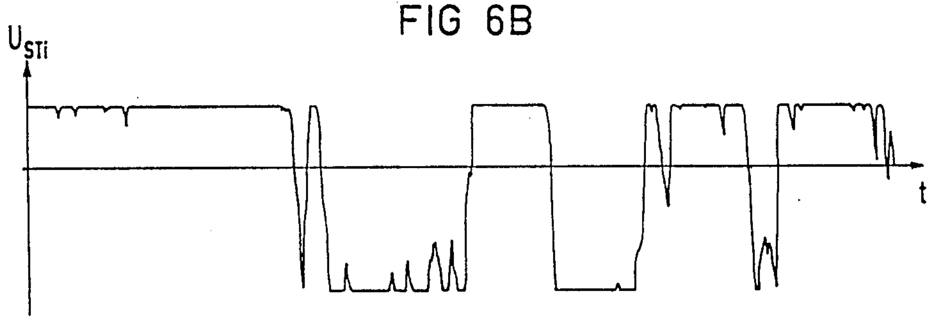
Figure 6D:
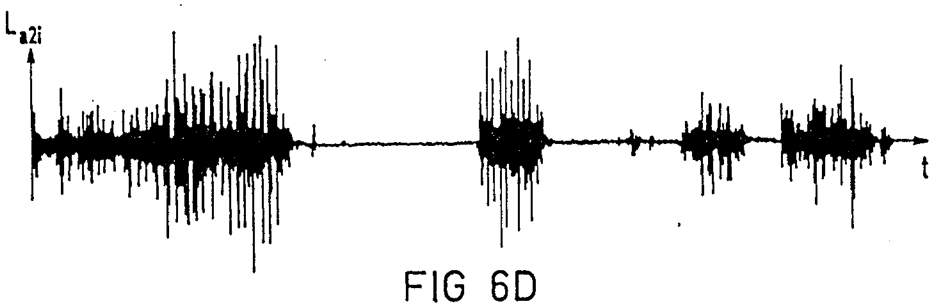

FIG. 8 shows an expansion of the system by additional AGC circuits 21 in each, or in selected ones of, the frequency-selecting channels 13*a* . . . *n*. The AGC circuit 21 includes a controlled-gain amplifier 22, and a rectification and smoothing feedback element 23. A frequency dependent compensation of the impaired hearing of the user is thus possible on the basis of the threshold switches, in addition to the noise-suppressing effect. The characteristics obtainable using the circuit of FIG. 8 are shown in FIG. 9. In principle, these individual channel AGC circuits 21 have the same properties as the AGC circuit 3 of FIG. 1. The various characteristic curves of FIG. 9 can be set by varying the cut-in points of the AGC circuits 21.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit for transmitting speech comprising:

an acoustic input transducer means for converting broadband audio speech signals into electrical signals at an output connected to a plurality of channels, each channel having a channel input and a channel output;

in each channel, a controlled-gain amplifier having an output which forms the channel output, an automatic gain controlled amplifier connected in series between the channel input and the input for said controlled gain amplifier, and a control signal forming stage connected in series between the channel input and the control input for said controlled gain amplifier, said control signal forming stage including, in succession from said channel input, a filter stage and a voltage controlled switch means having a switching threshold which is selectively settable for each channel for generating a control signal for said controlled-gain amplifier which disconnects that channel from the channel output if the signal from said filter stage falls below said switching threshold;

means connected to each channel output for summing the channel output signals to form a sum signal; and an acoustic output transducer means connected to said means for summing for converting said sum signal into an audio signal.

2. A circuit as claimed in claim 1 and wherein said filter stage comprises a rectifier connected to the channel input and a low-pass smoothing filter connected in series with said rectifier and wherein said voltage controlled switch means comprises a comparator having a first input connected to an output of said low-pass smoothing filter, and having a second input for setting said switching threshold.

3. A circuit as claimed in claim 2 wherein said comparator has an output in the form of a square wave, and wherein said control signal forming stage further comprises pulse-shaping means for rounding the square-wave output of the comparator.

* * * * *